(12) United States Patent
Herden et al.

(10) Patent No.: US 8,494,321 B2
(45) Date of Patent: Jul. 23, 2013

(54) DIODE LASER HAVING A DEVICE FOR BEAM FORMING

(75) Inventors: Werner Herden, Gerlingen (DE); Bernd Schmidtke, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/733,644

(22) PCT Filed: Jul. 22, 2008

(86) PCT No.: PCT/EP2008/059608
§ 371 (c)(1),
(2), (4) Date: Mar. 12, 2010

(87) PCT Pub. No.: WO2009/037036
PCT Pub. Date: Mar. 26, 2009

(65) Prior Publication Data
US 2010/0202733 A1 Aug. 12, 2010

(30) Foreign Application Priority Data
Sep. 14, 2007 (DE) .......................... 10 2007 044 011

(51) Int. Cl.
*G02B 6/30* (2006.01)
*G02B 6/36* (2006.01)

(52) U.S. Cl.
USPC .............. 385/49; 385/89; 372/50.12; 264/2.7

(58) Field of Classification Search
USPC 385/39, 49, 88, 89, 93; 372/6, 50.12; 264/2.7
See application file for complete search history.

(56) References Cited

U.S. PATENT DOCUMENTS

| 3,864,018 | A | * | 2/1975 | Miller | ............................. 385/98 |
|---|---|---|---|---|---|
| 3,920,432 | A | * | 11/1975 | Smith | ............................. 65/408 |
| 4,106,847 | A | | 8/1978 | Arnaud | |
| 4,529,426 | A | * | 7/1985 | Pleibel et al. | ................... 65/403 |
| 4,762,387 | A | * | 8/1988 | Batdorf et al. | .................. 385/71 |
| 5,204,927 | A | | 4/1993 | Chin et al. | |
| 5,268,978 | A | | 12/1993 | Po et al. | |
| 5,771,324 | A | * | 6/1998 | Hargis | ............................. 385/43 |
| 5,991,492 | A | * | 11/1999 | Ota et al. | ....................... 385/137 |
| 6,132,107 | A | * | 10/2000 | Morikawa | ......................... 385/89 |
| 6,901,185 | B2 | * | 5/2005 | Sasaki et al. | .................... 385/33 |
| 7,266,282 | B2 | * | 9/2007 | Qiu et al. | ....................... 385/137 |
| 7,542,642 | B2 | * | 6/2009 | Monma et al. | ................... 385/49 |
| 2004/0105482 | A1 | | 6/2004 | Sugiyama et al. | |

FOREIGN PATENT DOCUMENTS

| DE | 10 2004 006 932 | 10/2005 |
|---|---|---|
| EP | 0 723 323 | 7/1996 |
| JP | 49-108988 | 10/1974 |
| JP | 5-93828 | 4/1993 |

(Continued)

*Primary Examiner* — Daniel Petkovsek
(74) *Attorney, Agent, or Firm* — Kenyon & Kenyon LLP

(57) ABSTRACT

A diode laser having a beam-forming device and a method for producing it are described. The diode laser includes at least one diode laser bar, the diode laser bar having a multitude of emitters, the emitters being disposed next to each other in the direction of their longitudinal axes. The diode laser includes a beam-forming device assigned to the diode laser bar, for the laser beam emerging from the diode laser bar, the beam-forming device having a light-guide device having a plurality of fibers, into which the laser beam is coupled. The maximum thickness of the optical fibers at their end facing the diode laser bar is considerably smaller than their width.

9 Claims, 24 Drawing Sheets

FOREIGN PATENT DOCUMENTS

| | | |
|---|---|---|
| JP | 6-18751 | 1/1994 |
| JP | 6-27335 | 2/1994 |
| JP | 08 271763 | 10/1996 |
| JP | 11-44821 | 2/1999 |
| JP | 2000-275454 | 10/2000 |
| JP | 2001/296448 | 10/2001 |
| JP | 2002/277688 | 9/2002 |
| JP | 2004-279944 | 10/2004 |
| WO | 96/38749 | 12/1996 |
| WO | 97/42533 | 11/1997 |

* cited by examiner (A-A)

(B-B)

(C-C)

(A'-A')

(B'-B')

(C'-C')

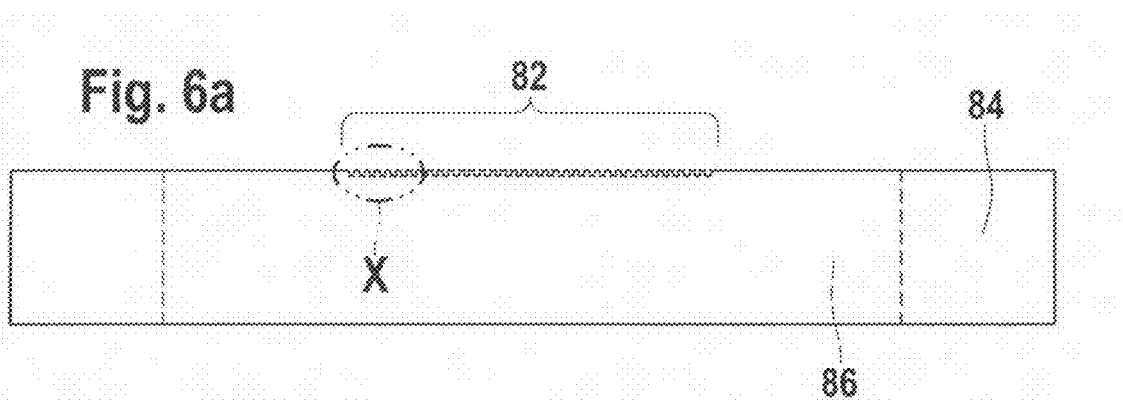
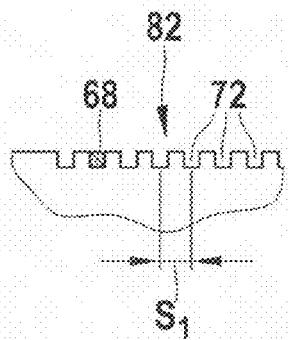
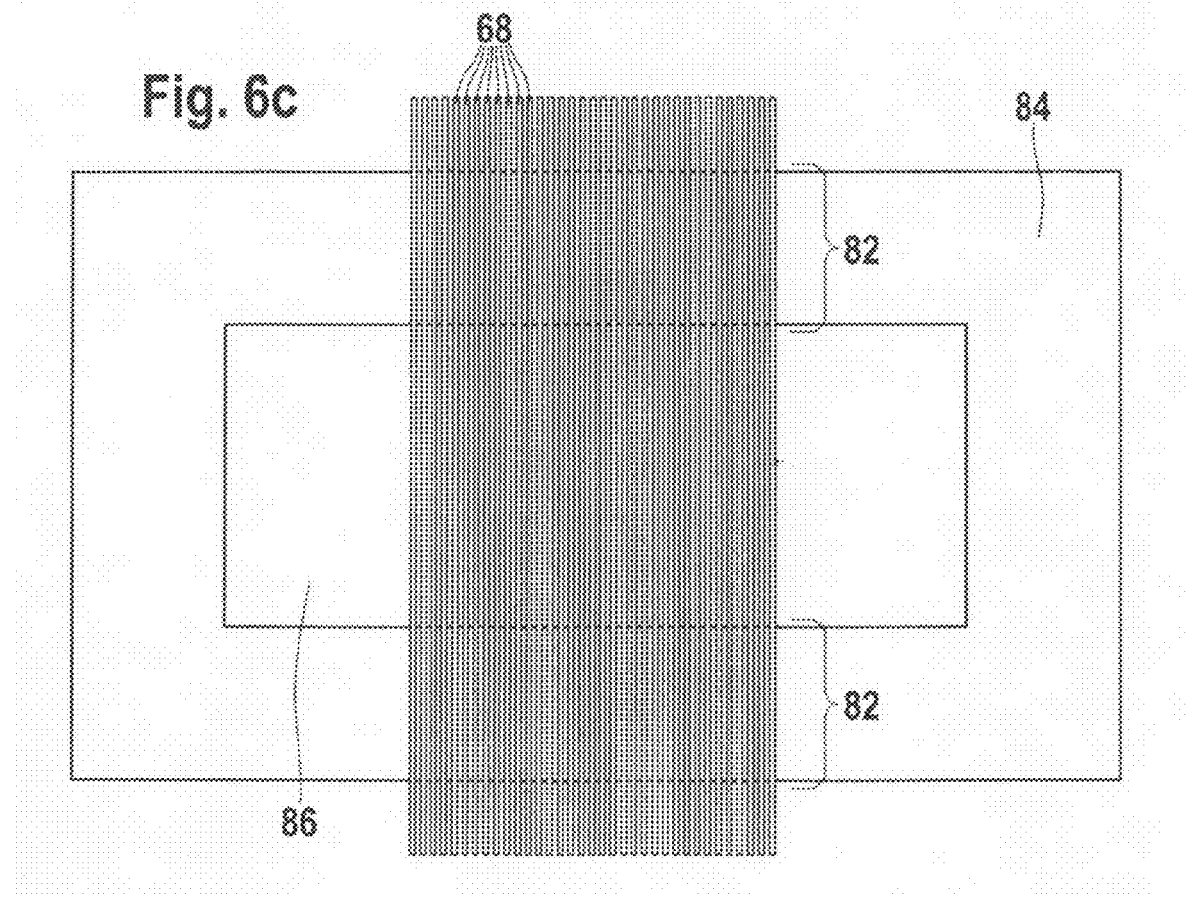

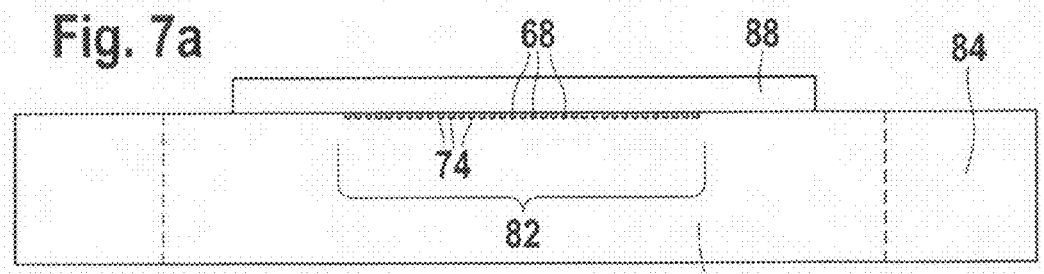
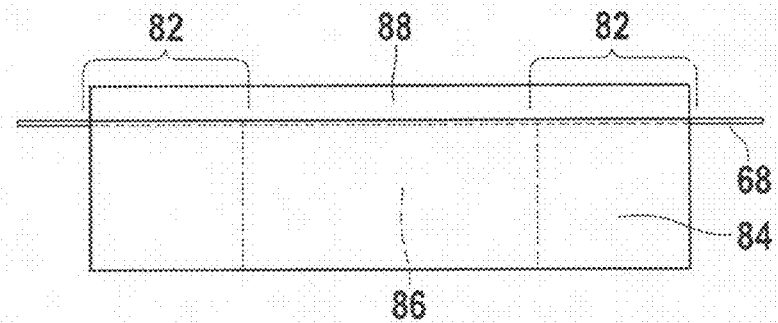
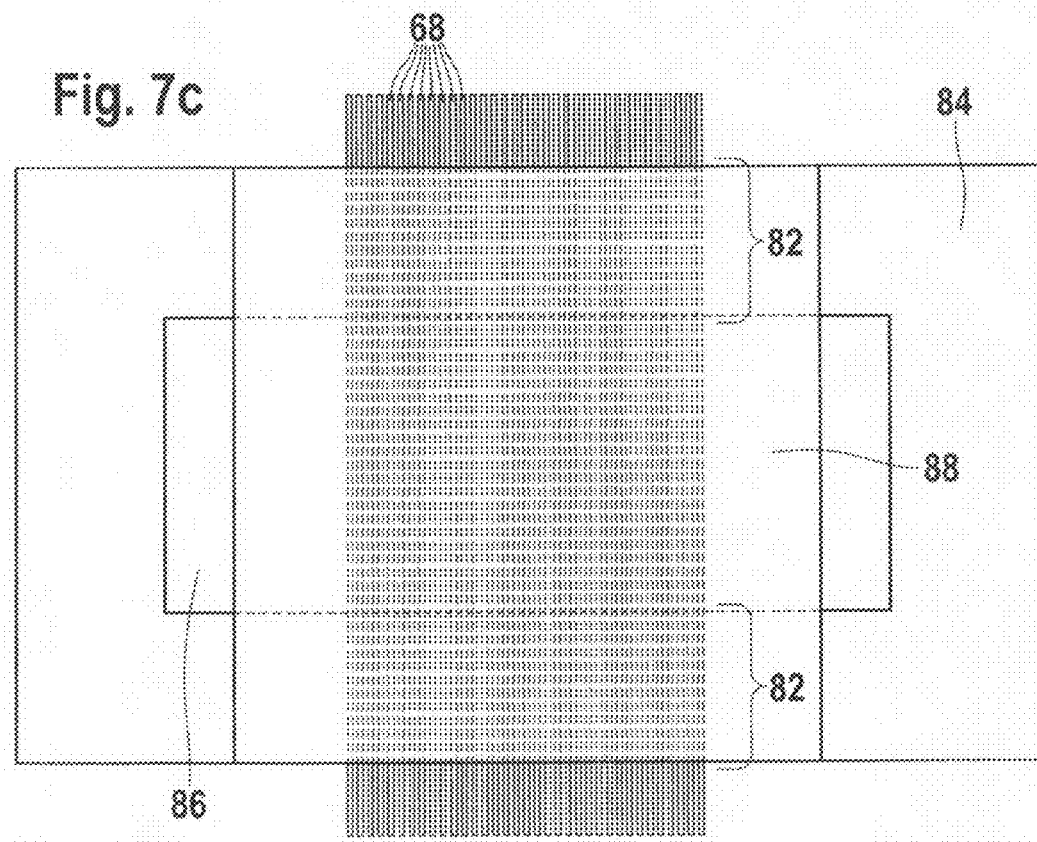

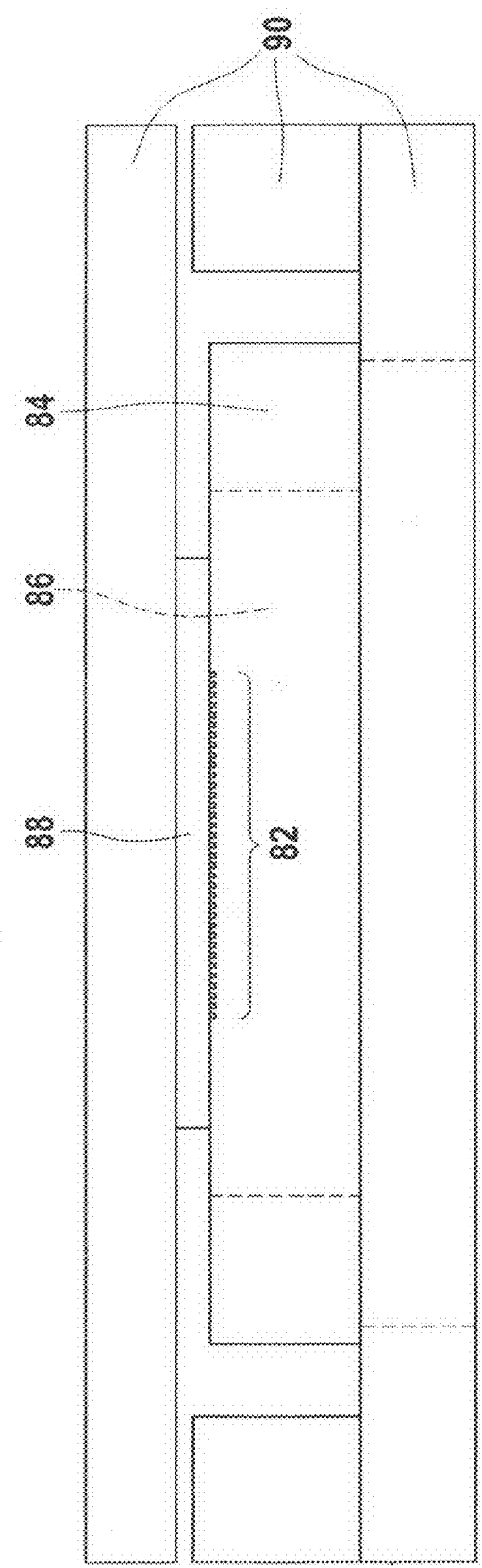

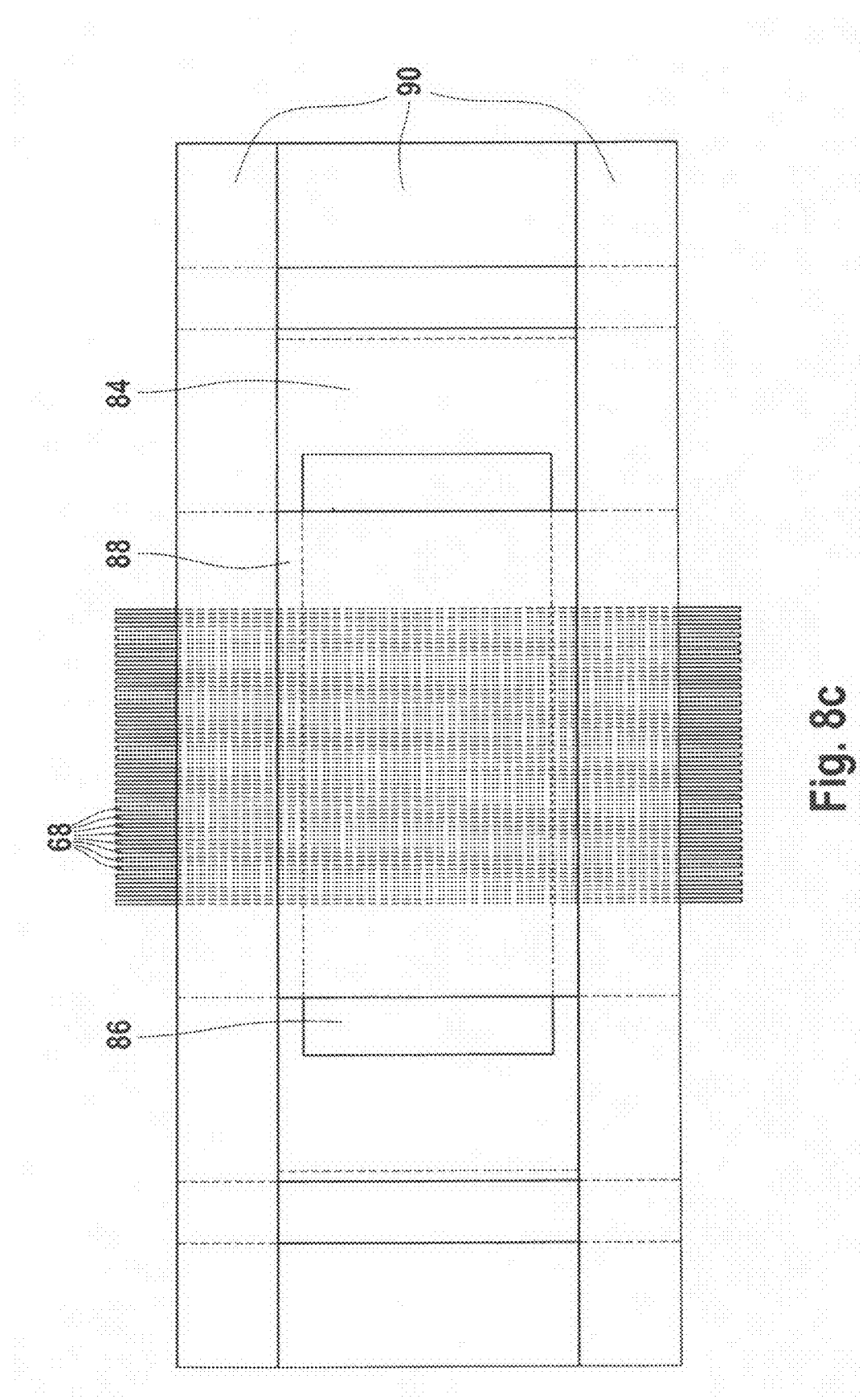

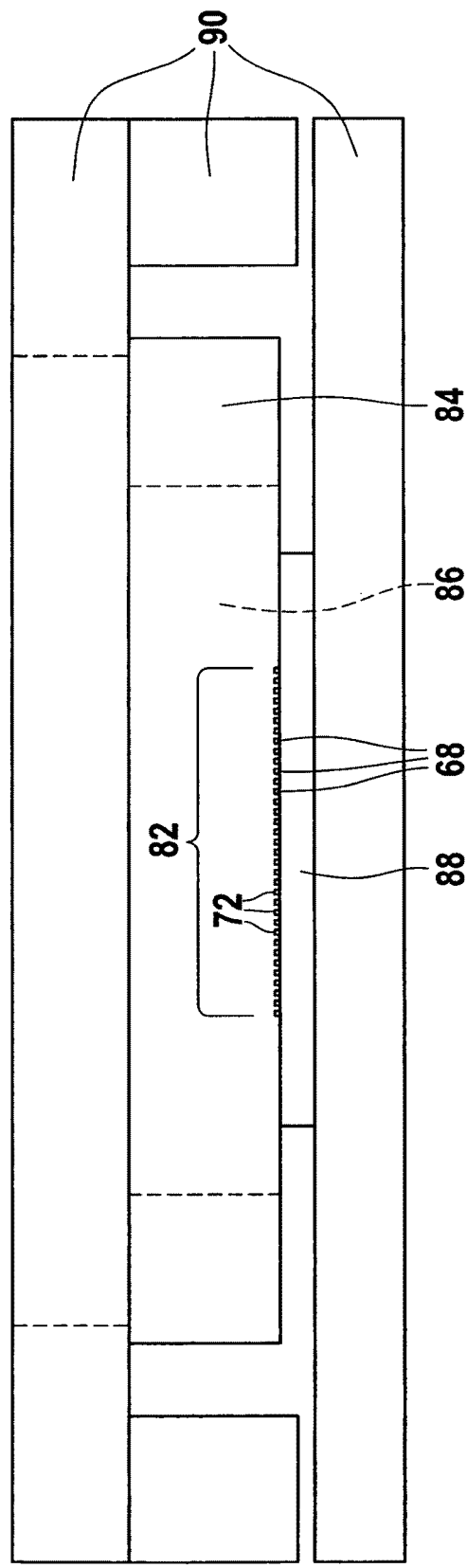

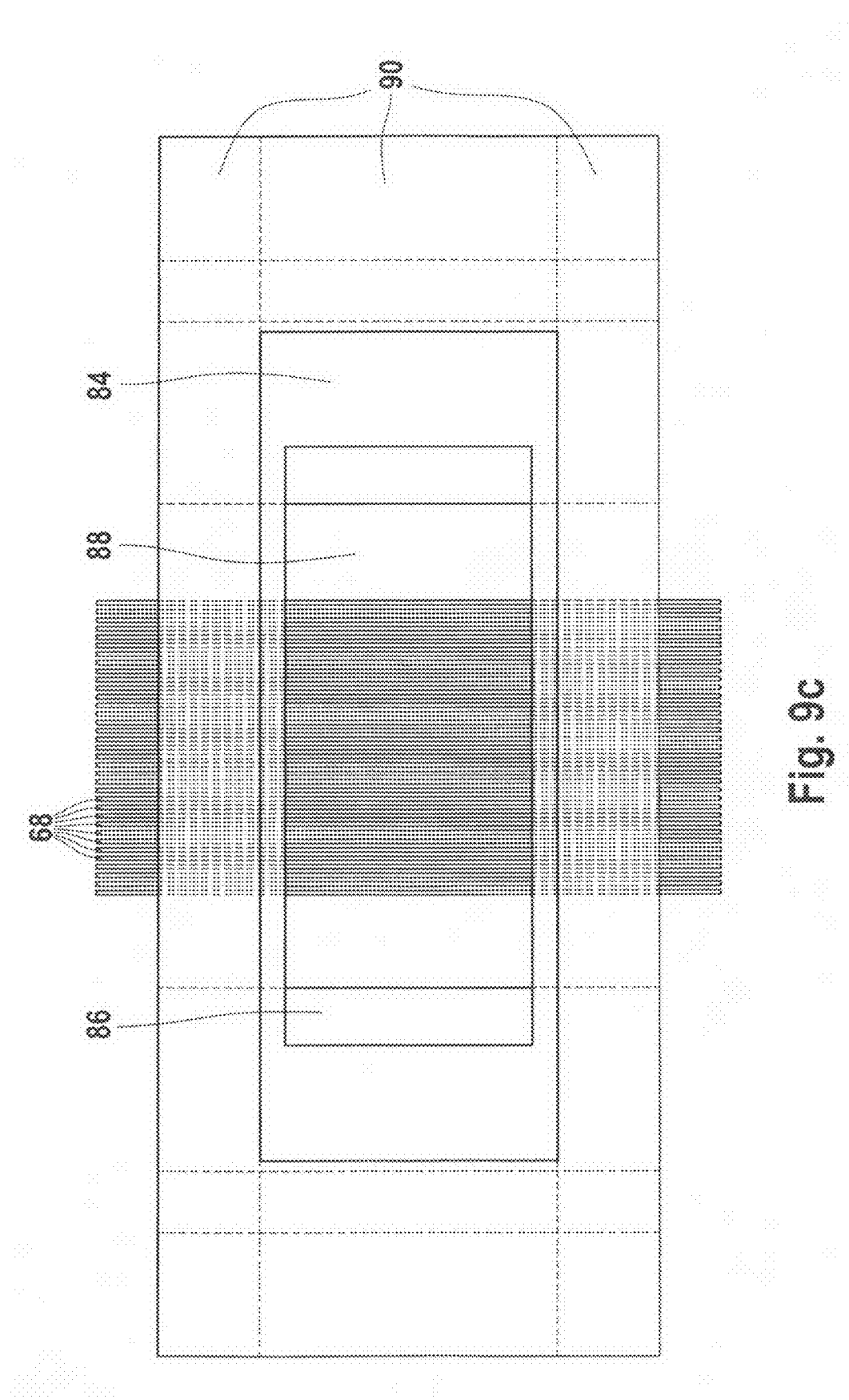

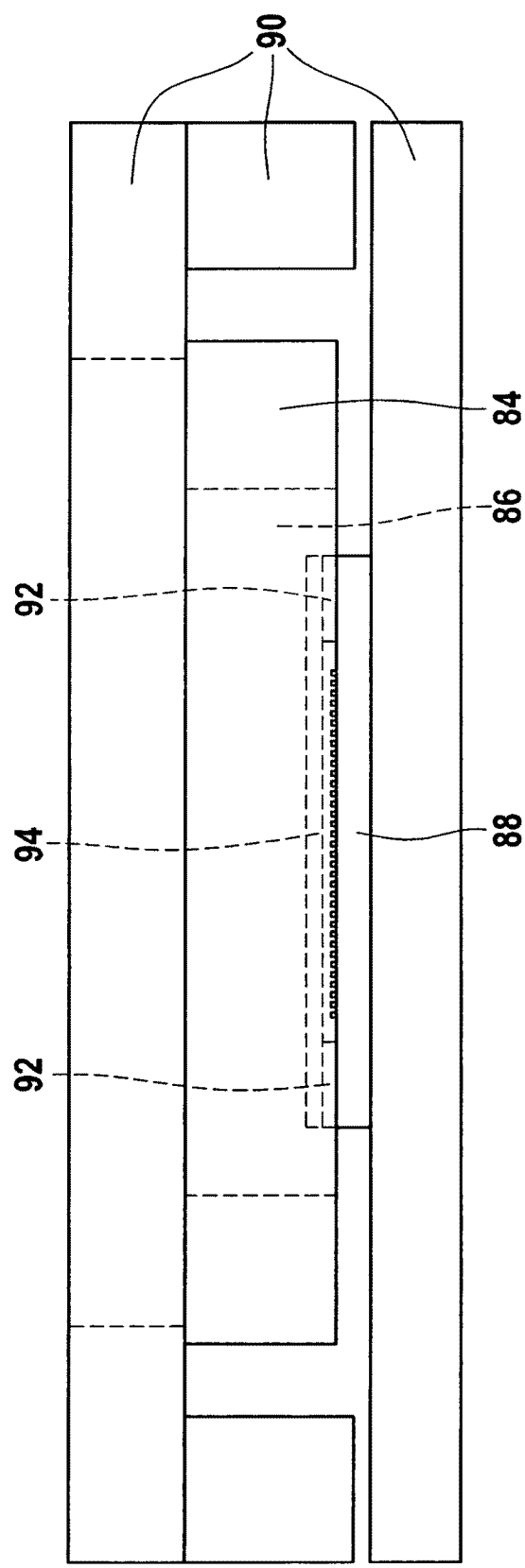

DIODE LASER HAVING A DEVICE FOR BEAM FORMING

FIELD OF THE INVENTION

The present invention relates to a diode laser having a device for beam forming, in which the in-coupling of the laser light emitted by the diode laser is improved further, and further relates to a method for producing a beam-forming device of such a diode laser.

BACKGROUND INFORMATION

German patent document DE 10 2004 006 92 B2 discusses a diode laser having a device for beam forming. In this diode laser the ends of the optical fibers are deformed on the coupling side such they fuse with the neighboring optical fibers and take on a rectangular cross-section. This is meant to achieve optimal in-coupling of the laser light emitted by the emitters of the diode laser, into the optical fibers.

SUMMARY OF THE INVENTION

According to the exemplary embodiments and/or exemplary methods of the present invention, in a diode laser having at least one diode laser bar, the diode laser bar having a multitude of emitters, the emitters being disposed next to each other in the direction of their longitudinal axes, and having a beam-forming device assigned to the diode laser bar for the laser beam emerging from the diode laser bar, the beam-forming device including a light-guide device having a plurality of fibers into which the laser beam is coupled, the object is achieved in that the fibers have an elliptical cross-section at their ends facing the diode laser bar.

The deformation of the cross-section of the fibers at their ends facing the diode laser bar makes it possible to approximate the cross-section of the fibers to the outlet cross-section of the emitters of the diode laser bar, so that the diameter of the fibers is able to be reduced without changing the in-coupled light capacity. For example, by beveling the originally circular cross-section of the fibers to one half of its size, the width of the fiber being enlarged correspondingly, it is possible to achieve a light output (brightness) per area and solid angle that is increased by a factor of four.

It is therefore possible to use thinner and thus more cost-effective optical fibers, and the shaping of the light at the exit of the light guide is able to be improved in its optical quality.

In one further advantageous development of the present invention, the beam-forming device includes at least one optical element, which is integrally joined to the optical fibers. The sheathing of the optical fibers in the region of the optical element may be removed prior to joining the optical element to the optical fibers in an integral manner. The optical element may be made from glass. In this way the light conduction characteristic of the fibers on the in-coupling side of the light guide is not defined by the difference in the refractive index between fiber core and the sheath of the fibers, but between the fiber core and the optical element.

This results in additional degrees of freedom in the optical configuration of the beam-forming device. In particular, the angle of divergence of the radiation coupled into the fiber is able to be enlarged by suitable selection of the glass and suitable shaping of the optical element, so that a further optimization of the in-coupling of the laser light into the light guide is made possible. Here, considerable optimization potential exists by way of appropriate selection of the combination of the glass qualities of optical element and fibers.

The object mentioned in the introduction is also achieved by a method for producing a beam-forming device of a diode laser, in which the fibers of a light guide are initially aligned in a center section in such a way that a plurality of fibers runs in one plane and parallel to one another. Then, the fibers in the center section are heated to their softening point. In this state the fibers in the center section are compressed with the aid of one or a plurality of molded parts until they have obtained the desired cross-section; at the same time they are integrally joined to the molded parts. The integral connection may also be implemented by subsequent addition of a suitable adhesive agent. The fibers are then separated in a separation plane that runs through the center section and orthogonally to the fibers.

The separation of the fibers produces two ends of light guides having deformed cross-sections of the fibers according to the present invention. This means that two light guides according to the present invention are able to be produced by implementing the method according to the present invention a single time, all methods steps having to be executing only once. Therefore, the method of the present invention is characterized by high efficiency and economy.

In addition, it is easier to align, or guide, the fibers parallel to each other in a center section, i.e., not at an end of the light guide, compared to fibers that would need to be aligned at an end of the light guide.

In one further advantageous development of the method according to the present invention, the fibers are cooled below their softening temperature following the pressing operation, so that no further deformation takes place.

It is especially advantageous if the fibers are aligned in such a way that their lateral spacing corresponds to the spacing of the emitters of a diode laser bar in the direction of the slow-axis. In this way, the subsequent assignment of a fiber to an emitter of the diode laser bar is achieved with the necessary precision while implementing the method according to the present invention. This is particularly advantageous from an economical standpoint in a series production. In addition, the in-coupling of the light emitted by the diode laser bar into the light guide is improved and simplified.

Another particularly advantageous development of the present invention provides for the molded parts to enter into an integral connection with the fibers in the region of the center section during the pressing process. These molded parts may be made from glass, the sides of the molded parts facing the fibers possibly having the desired form of the fibers of the light guide, so that the molded parts first of all bring about the desired deformation of the optical fibers and, having fused with the fibers, then serve as optical element.

These molded parts therefore permit additional degrees of freedom in the design of the coupling device and, due to their larger dimensions and their robustness, allow simpler processing of the light guide on the coupling side. The optical element may be made from an opaque material, such as metal, or from a material transmissive for laser radiation, such as glass. If the optical element is made of glass, then it may be ground and polished and designed in the form of a cylindrical lens or a prism.

If a separate insert is placed in the form tool above and below the fibers, then it is recommended to cut the inserts together with the fibers. This may be done by sawing or grinding, for example. As an alternative, it is also possible to insert two inserts above the fibers and below the aligned fibers, the inserts being in contact in the region of a separation surface (C-C). In this way, the fibers simultaneously may be integrally connected to the inserts during the pressing operation, so that it will not be necessary later on to cut the entire optical element again. In this case the only task that remains to be carried out is to separate the fibers in the region of the separation surface.

It has shown to be advantageous if the lateral distance of the fibers relative to each other is able to be set by v-grooves, recessed v-grooves or semi-circular grooves. As an alternative, this may be accomplished by corresponding grooves in one of the molded parts or a frame surrounding the molded parts. This prevents "twisting" or "crossing" of the fibers in the region of the center section in a reliable and simple manner.

Additional advantages and advantageous embodiments of the present invention may be found in the following drawing, and its description. In this context, all the features described in the drawing, their description, and the claims may be essential to the present invention, both individually and in any combination with one another.

BRIEF DESCRIPTION OF THE DRAWINGS

FIG. 1b shows a schematic representation of the ignition device in FIG. 1a.

FIGS. 6, 7, 8, 9, 10, 11 and 12 show a second exemplary embodiment of the method according to the present invention, in various stages.

DETAILED DESCRIPTION

Figure 1A:
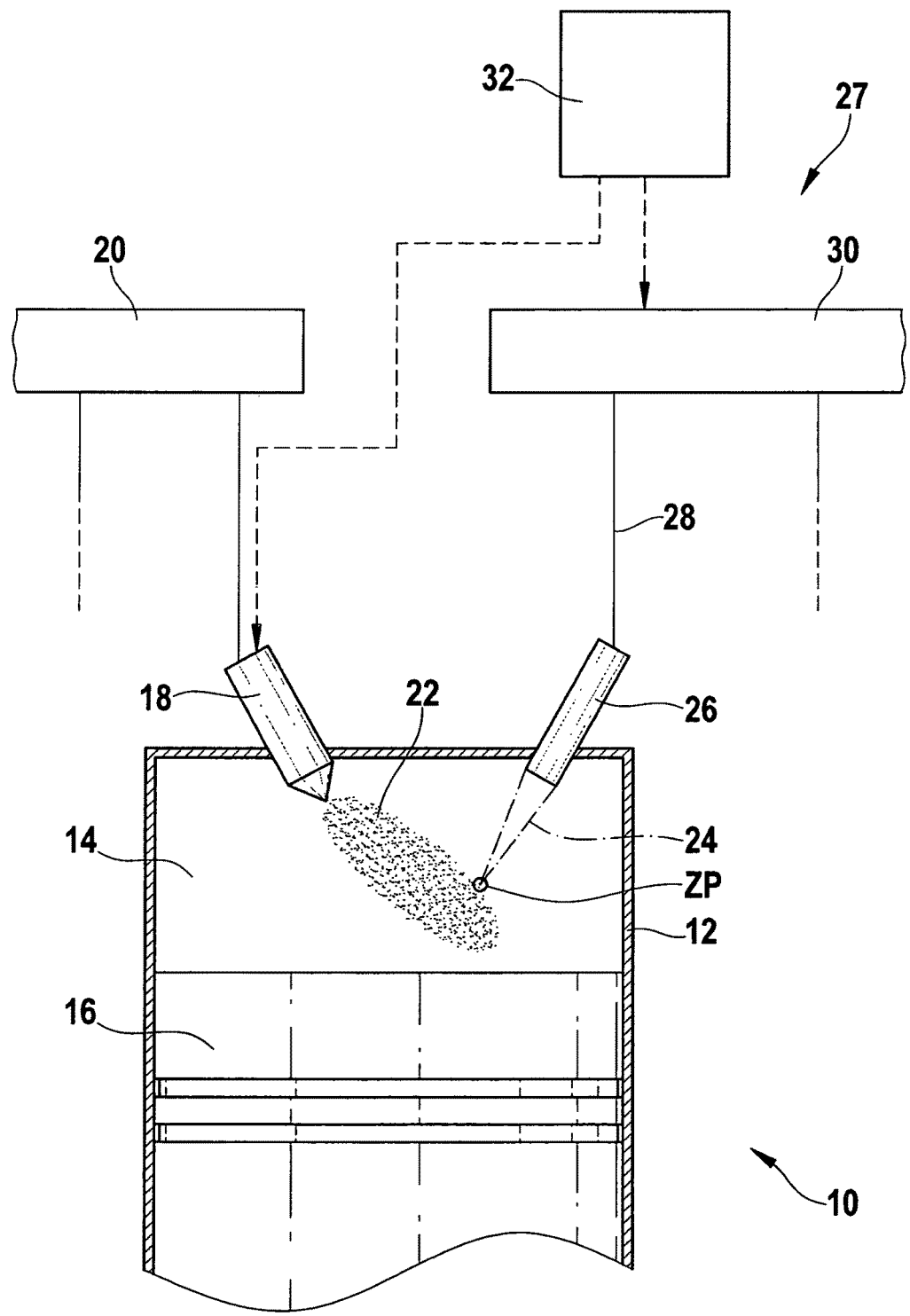
FIG. 1a shows a schematic illustration of an internal combustion engine having a laser-based ignition device.

In FIG. 1a, an entire internal combustion engine is denoted by reference numeral 10. It may be used for driving a motor vehicle that is not shown. Internal combustion engine 10 includes a plurality of cylinders, of which only one, having a reference numeral 12, is shown in FIG. 1. A combustion chamber 14 of cylinder 12 is bounded by a piston 16. Fuel reaches combustion chamber 14 directly through an injector 18, which is connected to a fuel pressure reservoir 20 which is also referred to as a rail.

Fuel 22 injected into combustion chamber 14 is ignited using a laser pulse 24, which is eradiated into combustion chamber 14 by an ignition device 27 which includes a laser device 26. For this purpose, laser device 26 is fed, via a light-guide device 28, with pumped light which is provided by a pumped light source 30. Pumped light source 30 is controlled by a control unit 32, which also triggers injector 18.

Figure 1B:
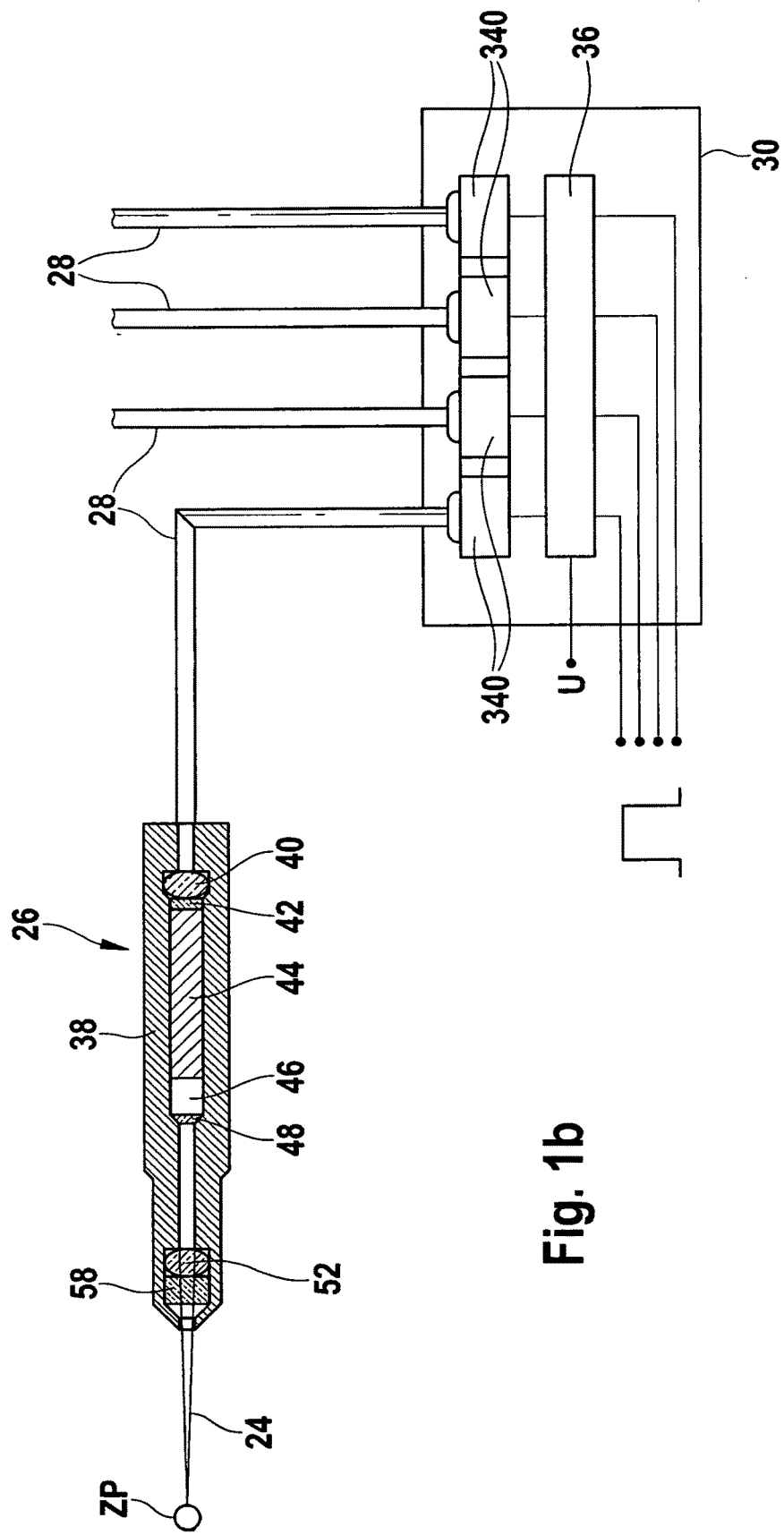

As may be seen in FIG. 1b, pumped light source 30 feeds a plurality of light-guide devices 28 for different laser devices 26, which are allocated to a particular cylinder 12 of internal combustion engine 10 in each case. Toward this end, pumped light source 30 includes a plurality of single laser light sources 340, which are connected to a pulsed current supply 36. The presence of the plurality of individual laser light sources 340 provides a virtually "stationary" distribution of pumped light to the various laser devices 26, so that no optical distributors or the like are required between pumped light source 30 and laser devices 26.

For example, laser device 26 has a laser-active solid-state body 44 having a passive Q-switch 46, which in conjunction with a coupling mirror 42 and an output coupler 48 forms an optical resonator. When pumped light generated by pumped light source 30 is applied, laser device 26 generates a laser pulse 24 in a manner known per se, which a focusing optics 52 focuses on an ignition point ZP situated in combustion chamber 14 (FIG. 1a). The components located inside housing 38 of laser device 26 are separated from combustion chamber 14 by combustion chamber window 58.

Figure 2:
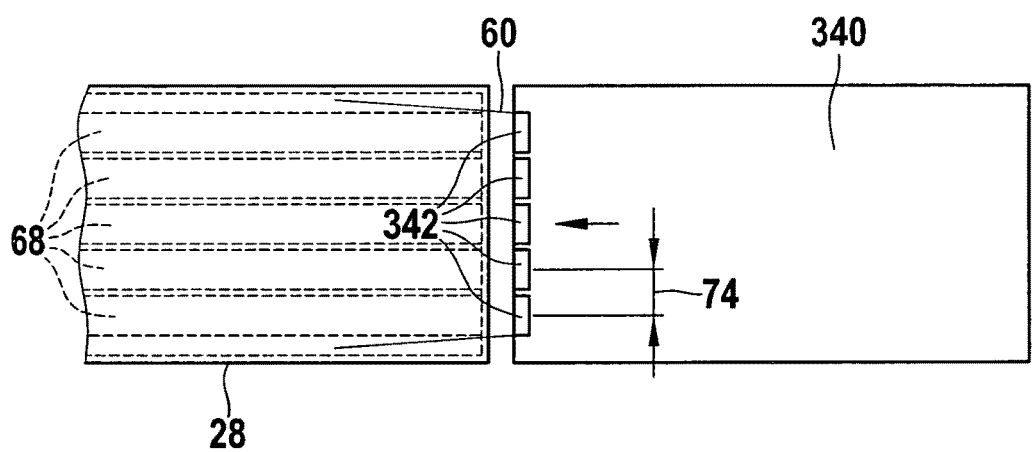
FIG. 2 shows a schematic plan view of a laser light source according to the present invention of the ignition device from FIG. 1b.

FIG. 2 shows a schematic plan view of a first specific embodiment of laser light source 340 according to the present invention. As can be gathered from FIG. 2, laser light source 340 includes a plurality of emitters 342 emitting laser light, whose laser light is used as pumped light 60 for the optical pumping of laser device 26 (FIG. 1b) or laser-active solid-state body 44 situated therein, and which is coupled into light-guide device 28 accordingly. The lateral distance between emitters 342 has been denoted by reference numeral 74. Light-guide device 28 includes a multitude of optical fibers 68, which hereinafter are also referred to as fibers 68. In the exemplary embodiment shown in FIG. 2, an individual emitter 342 is allocated an individual optical fiber 68 in order to minimize the losses in the in-coupling of the pumped light, emitted by emitters 342, into light-guide device 28.

Using the method according to the present invention, the allocation of fibers 68 to emitters 342 is able to be improved; simultaneously, by deforming the cross-section of fibers 68 at their ends facing emitters 342, it is possible to reduce the diameters of the fibers without changing the in-coupled light capacity. This saves space and expense.

Using FIGS. 3 through 5, a first exemplary embodiment of the method according to the present invention will be described in the following text.

An aspect of the method according to the present invention is that fibers 68 are not brought into the desired shape and position at their ends, but that fibers 68 are brought into the desired shape and position in a center section 70 and are subsequently separated in this center section 70. This always creates two ends of a light-guide device 28 produced according to the present invention at one time, and the handling of fibers 68 is simplified at the same time.

The placement of fibers 68 at the desired lateral distance, which corresponds to lateral distance 74 between emitters 342, and the deformation of the cross-section of fibers 68 are accomplished with the aid of a lower molded part 64 and an upper molded part 66. Both molded parts 64 and 66 are integrally joined to fibers 68 using the method according to the present invention, and they then form an optical element, which enables or improves the in-coupling of the pumped light into light-guide device 28.

Figure 3A:
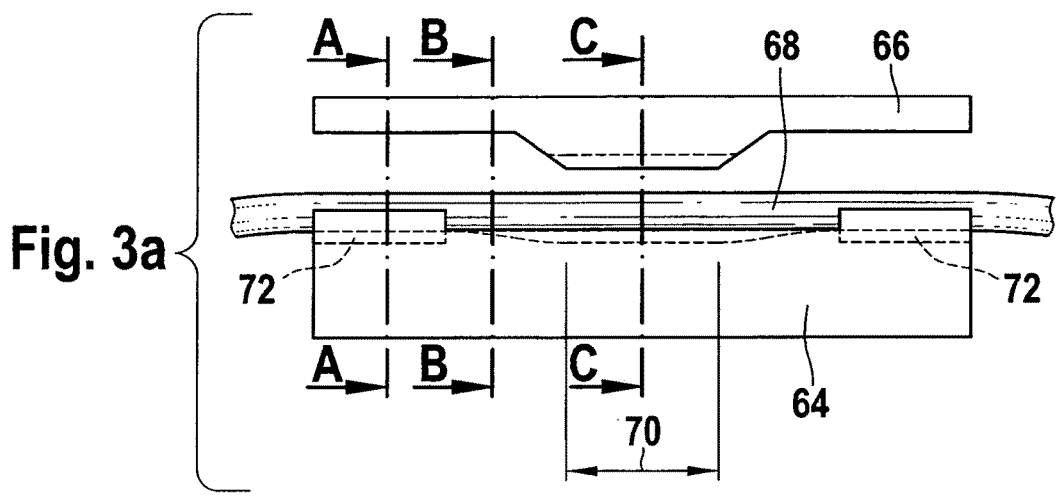
FIGS. 3, 4, and 5 show a first exemplary embodiment of the method according to the present invention, in various stages.
Figure 3B:
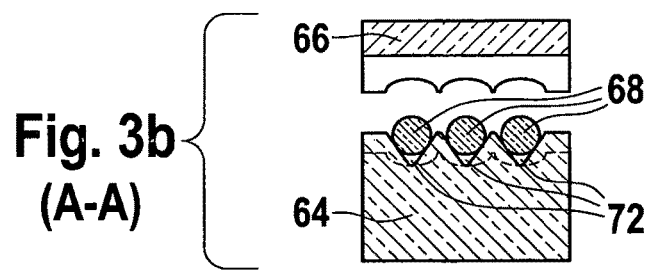
Figure 3C:
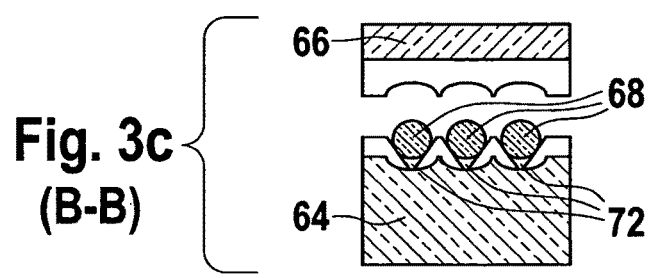

FIG. 3a shows a lateral view of lower molded part 64 and upper molded part 66. Molded parts 64, 66 have a symmetrical design in the longitudinal direction of fibers 68. The plane of symmetry C-C usually coincides with a separation plane whose meaning will be explained in the following text.

Disposed to the right and left of separation plane C-C is what is referred to as center section 70 of molded parts 64 and 66. The desired deformation of fibers 68 takes place in the region of center section 70, and molded parts 64 and 66 enter into an integral connection with fibers 68. For this reason, molded parts 64 and 66 have a "semi-elliptical" design in the region of the center section (cf. FIG. 3d, in particular).

Figure 4A:
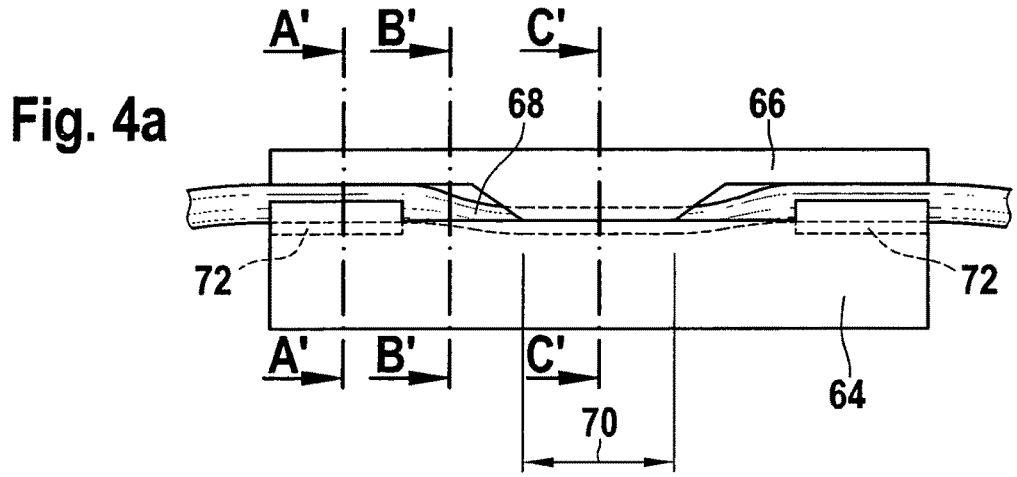
Figure 4B:
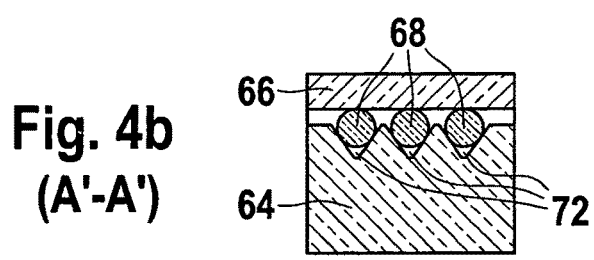
Figure 4C:
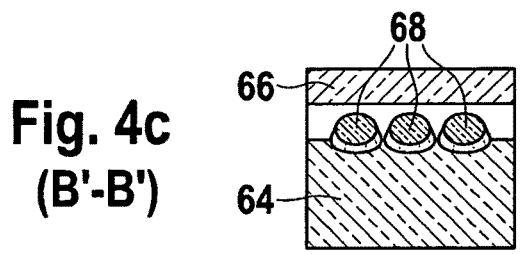
Figure 4D:
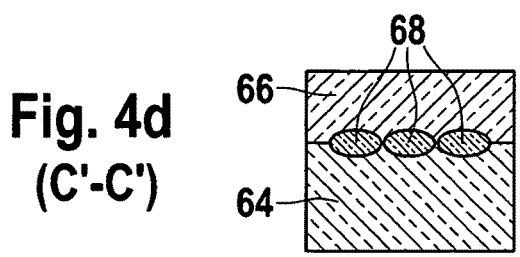

To the right and left of center section 70, at the location of sectional lines A-A and B-B, no permanent deformation of fibers 68 takes place. In the region of sectional lines A-A, fibers 68 are mutually aligned at the desired distance. This may be accomplished with the aid of V-shaped grooves 72 (cf. section A-A in FIG. 3b). The distance between grooves 72 corresponds to distance 74 between emitters 342 (cf. FIG. 2). Then upper molded part 66 is lowered onto lower molded part 64, as shown in FIG. 4a. This causes upper molded part 66 to come closer to lower molded part 64 in the region of sectional planes A-A (cf. FIG. 4b), such that fibers 68 are fixed inside grooves 72. In the area of section B-B (cf. FIG. 4c), fibers 68 are not clamped between upper molded part 66 and lower molded part 64 even when upper molded part 66 has been lowered.

If fibers 68 are then subjected to slight tensile stressing, it is ensured that fibers 68 exhibit the desired mutual distance in center region 70 as well. At the same time, fibers 68 are heated up to their softening temperature in the center section. The fiber alignment may also be achieved by suitable design of grooves 72. Especially suitable shapes of grooves 72 are illustrated in FIG. 13.

In the region of center section 70 (section C-C), molded parts 64, 66 deform fibers 68 in such a way that they take on an essentially elliptical cross-section. This cross-section is illustrated in the sectional view in FIG. 4d. Simultaneously with the deformation of fibers 68, molded parts 64 and 66 are integrally joined with fibers 68 and form an optical element. In addition, the connection may also be bonded subsequently. If, for example, a UV adhesive for fiber applications is used, then the adhesive penetrates the fibers due to the capillary effect of the fibers, so that a stable adhesive bond will be formed. Molded parts 64 and 66 may be made from glass, it being possible to use a different type of glass than for fibers 68.

Figure 3D:
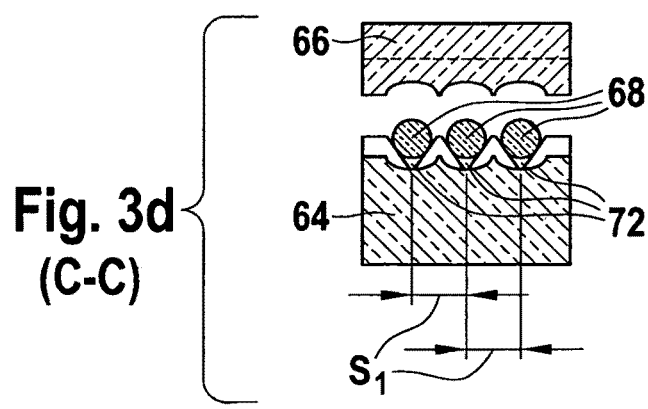

A lateral distance $S_I$ between fibers 68 is shown in sectional view C-C of FIG. 3d. This lateral distance $S_1$ corresponds to distance 74 between emitters 342 (cf. FIG. 2). This permanently fixes the fibers in place with regard to their lateral distance $S_1$, and the desired allocation of fibers 68 to individual emitters of the diode laser takes place.

Figure 5A:
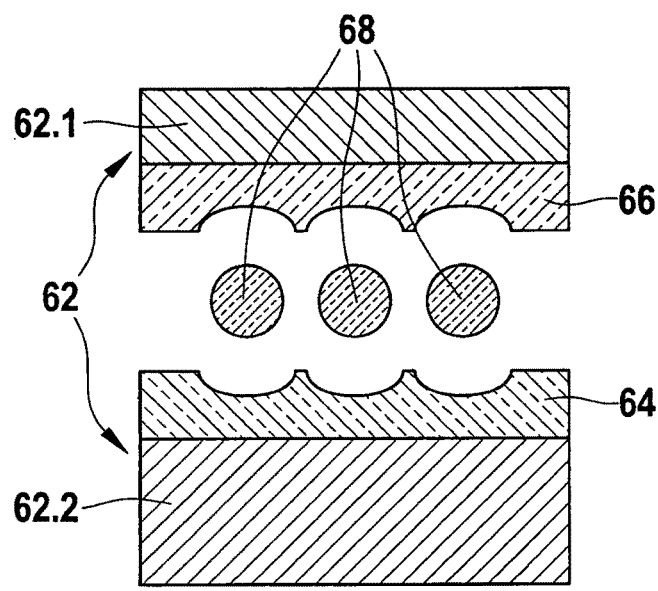

FIG. 5a shows the placement of molded parts 64 and 66 in an open compression molding die 62.1 and 62.2 in separation plane C-C, in an enlarged view. As can be gathered from FIG. 5a, molded parts 64 and 66 have semi-elliptical recesses (without reference numerals) on their sides facing fibers 68, which are utilized for deforming and accommodating fibers 68.

If compression molding die 62 is then closed, and at least fibers 68 have been brought to their softening temperature, molded parts 64 and 66 plastically deform fibers 68. At the same time, upper molded part 66, lower molded part 64, and fibers 68 are joined, so that a monolithic glass body is obtained. Optical element 80 is worked out of this glass body.

Figure 5B:
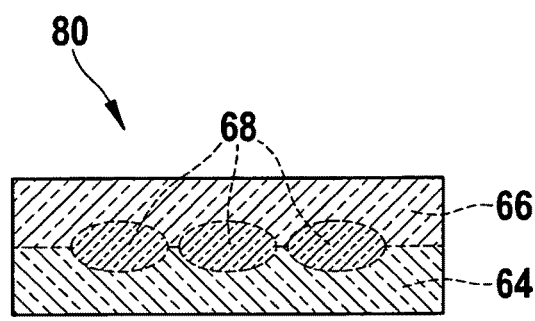

In FIG. 5b such an optical element 80 is shown in a sectional view, the solid lines indicating the former separation lines between fibers 68, a first insert 76 and a second insert 78.

In summary, the first exemplary embodiment of a method according to the present invention may be described here in greater detail with reference to FIGS. 3 through 5.

In a first step, a plurality of fibers 68 is aligned next to each other and inserted in grooves 72 of lower molded part 64. This is done on both sides of the center section (cf. sectional planes A-A in FIGS. 3b and 4b).

In an intermediate region (cf. sectional planes B-B in FIGS. 3c and 4c), molded parts 64 and 66 do not touch the fibers; instead, fibers 68 are situated in the gap between upper molded part 66 and lower molded part 64. It may be useful and advantageous if fibers 68 are kept under slight tensile stress following the alignment, so that fibers 68 do not droop in the region of center section 70 and have a straight characteristic.

In a next step, fibers 68 are heated, especially in the region of center section 70. This may be accomplished by infrared radiation, for example. As an alternative, upper molded part 66 and/or lower molded part 64 may be heated locally and the required heat provided in this manner. In so doing, fibers 68 attain at least their softening temperature, so that they are able to be deformed easily without breaking.

As soon as fibers 68 in the region of center section 70 have reached the softening temperature, compression molding die 62 is closed and upper molded part 66 thereby lowered onto lower molded part 64. In the process, force as well as heat may be transmitted to optical fibers 68 simultaneously. In addition, molded parts 64 and 66 enter into an integral connection with optical fibers 68. As an alternative or in addition, molded parts 64 and 66 and optical fibers 68 may also be adhesively bonded to one another.

Subsequently, optical fibers 68 are cooled until they are no longer able to be plastically deformed. Fibers 68 together with molded parts 64 and 66 are then separated in the region of the plane of symmetry and separation plane C-C, so that two pieces of a light-guide 28 are subsequently obtained, in which one end of fibers 68 is elliptically deformed according to the method of the present invention. The separation plane produced in the separation is then brought into the desired form, polished and coated, if necessary. It has shown to be especially suitable if molded parts 64 and/or 66 are produced from glass, the melting point of molded parts 64 and 66 being higher than the melting point of optical fibers 68.

With the aid of FIGS. 6 through 12, an additional exemplary embodiment of a method according to the present invention will now be explained. Identical components are provided with identical reference numerals, and the statements made with regard to FIGS. 1 through 5 apply accordingly.

In the exemplary embodiments according to FIG. 6 ff, the alignment of fibers 68 is accomplished with the aid of combs 82. These combs 82 are made up of a multitude of grooves 72 running parallel with each other. Combs 82 are disposed in a frame 84 along both sides of a rectangular recess 86. In the plan view of frame 84, recess 86 and fibers 68, aligned in parallel with one another by combs 82, can be seen quite clearly.

FIG. 6a shows combs 82 without fibers 68, while a fiber 68 and lateral distance $S_1$ has been plotted in the associated detail X (cf. FIG. 6b) for better understanding.

In a further step, a first glass wafer 88 is placed on frame 84 and fibers 68 lying on frame 84 (cf. FIG. 7). First glass wafer 88 extends across frame 84 in the direction of fibers 68 and retains fibers 68 inside grooves 72.

Figure 8B:
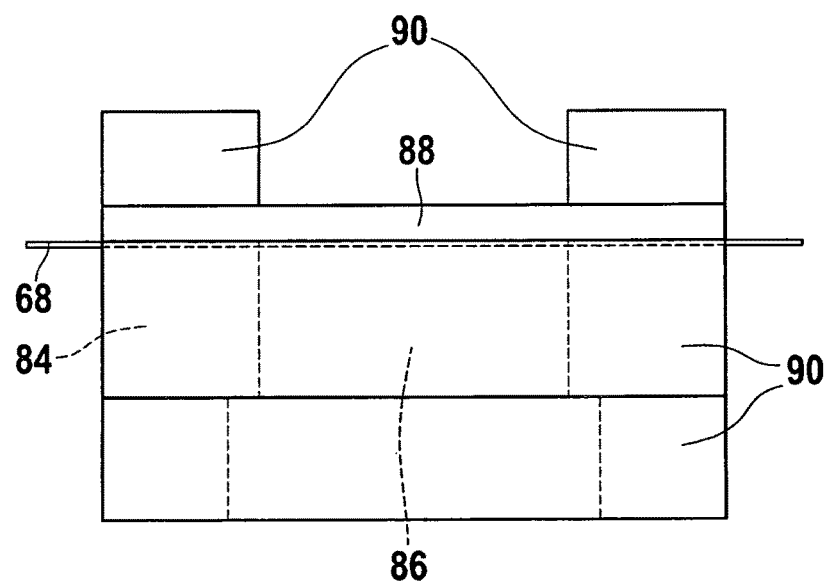
Figure 9B:
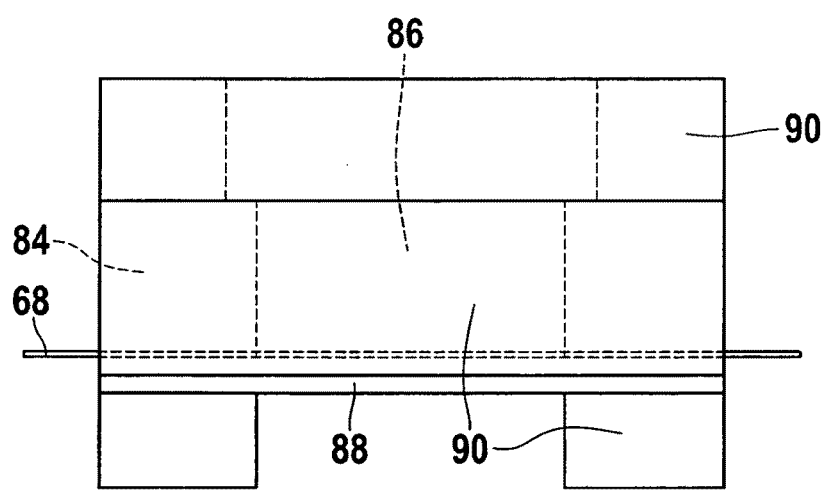

In a further step, which is illustrated in FIG. 8, frame 84, fibers 68 and first glass wafer 88 are fixed in place relative to each other by a plurality of holders 90, and the top side is rotated to point down (cf. FIG. 9).

Figure 10A:
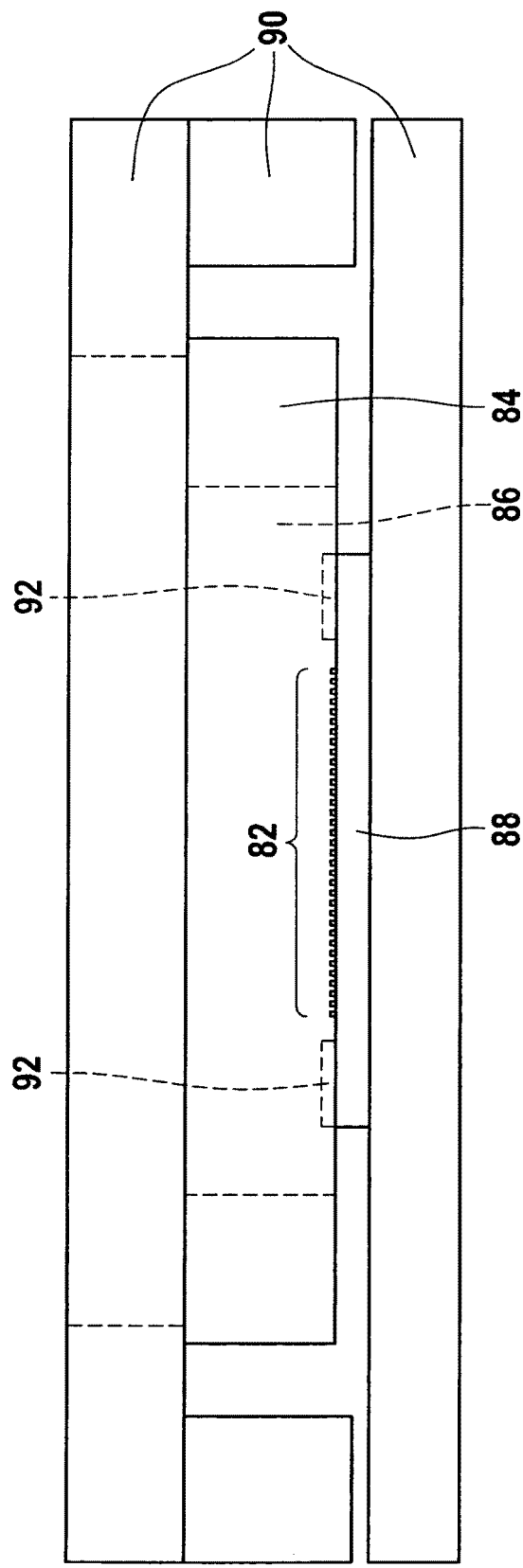
Figure 10B:
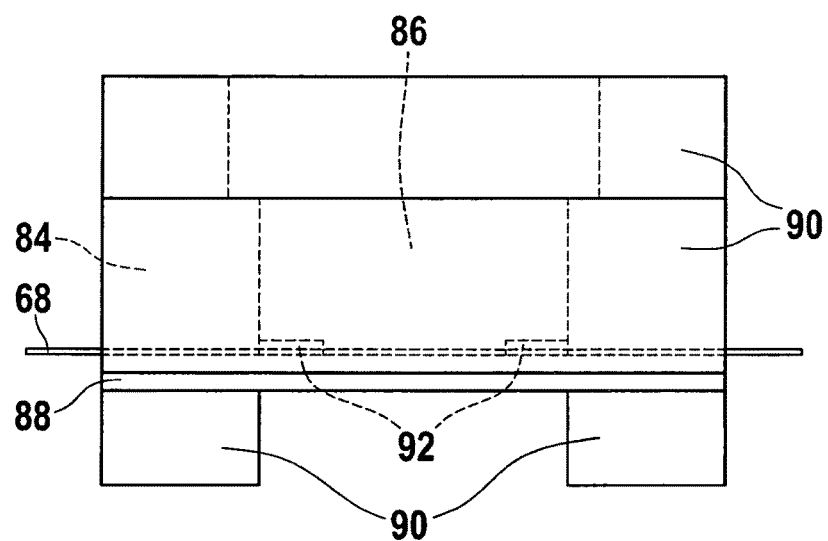
Figure 10C:
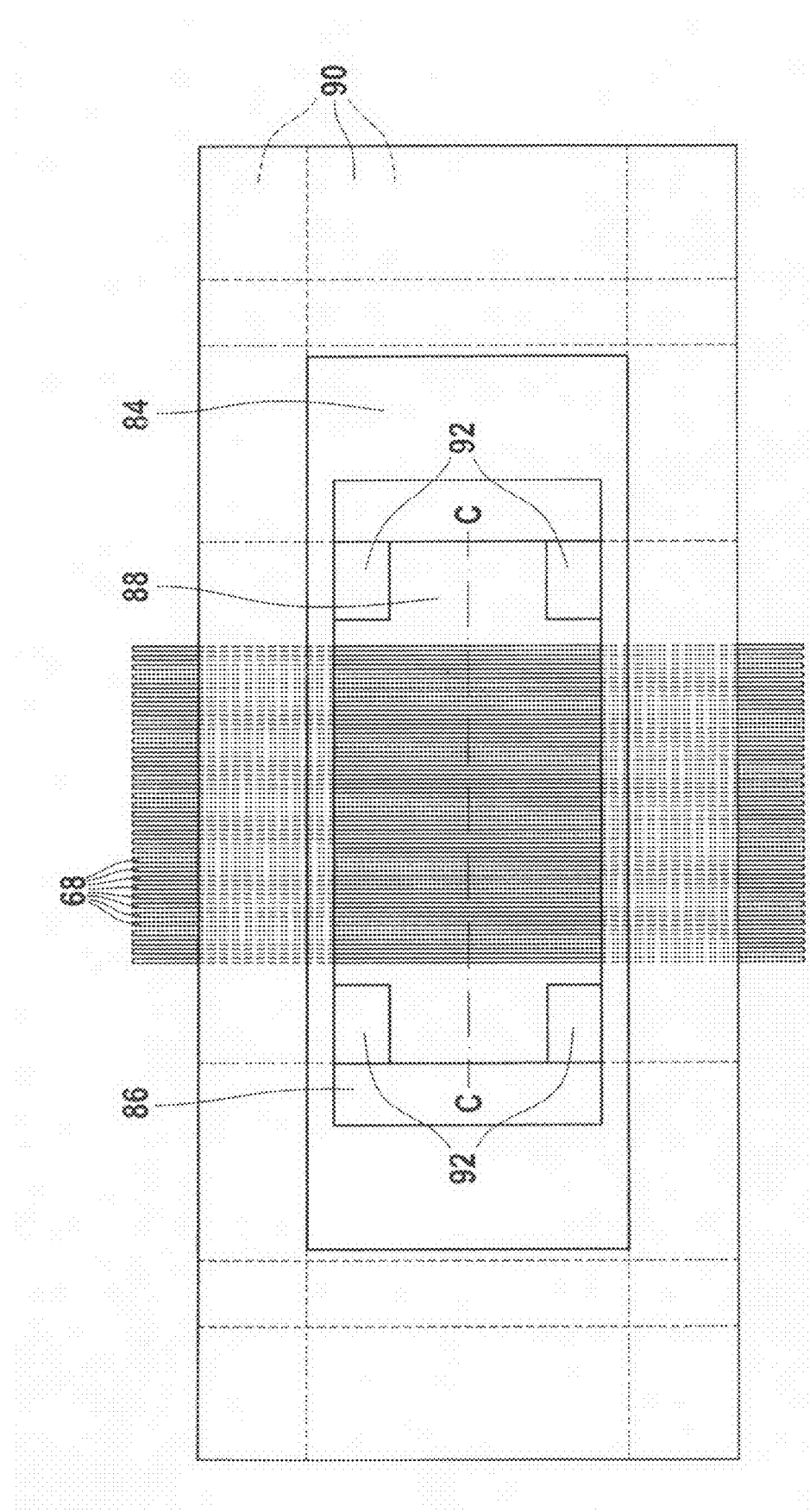
Figure 11B:
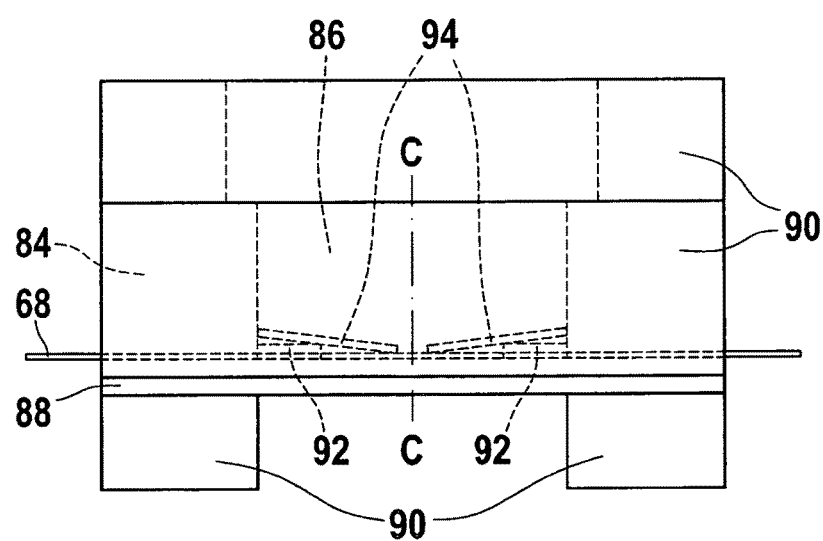
Figure 11C:
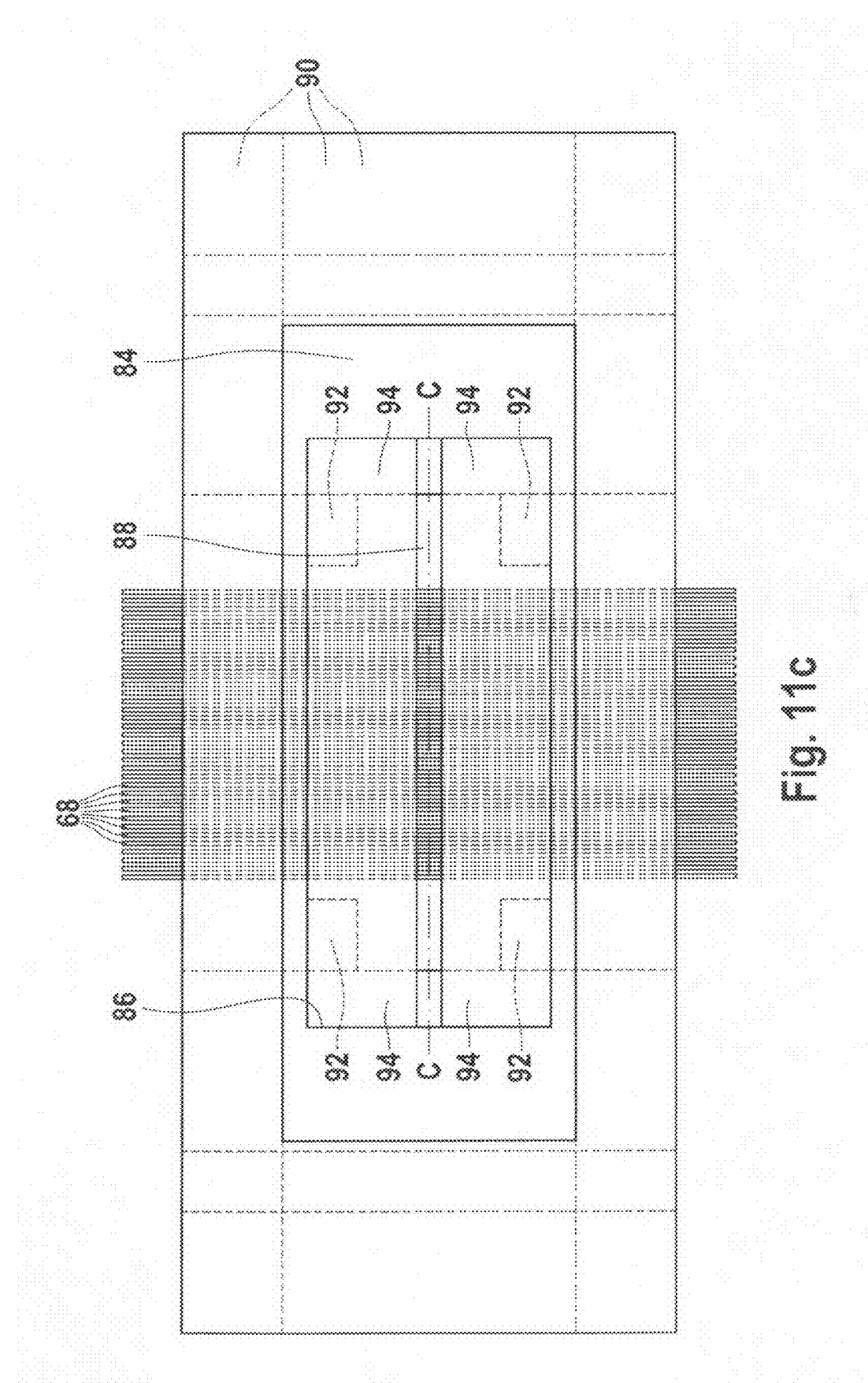
Figure 12A:
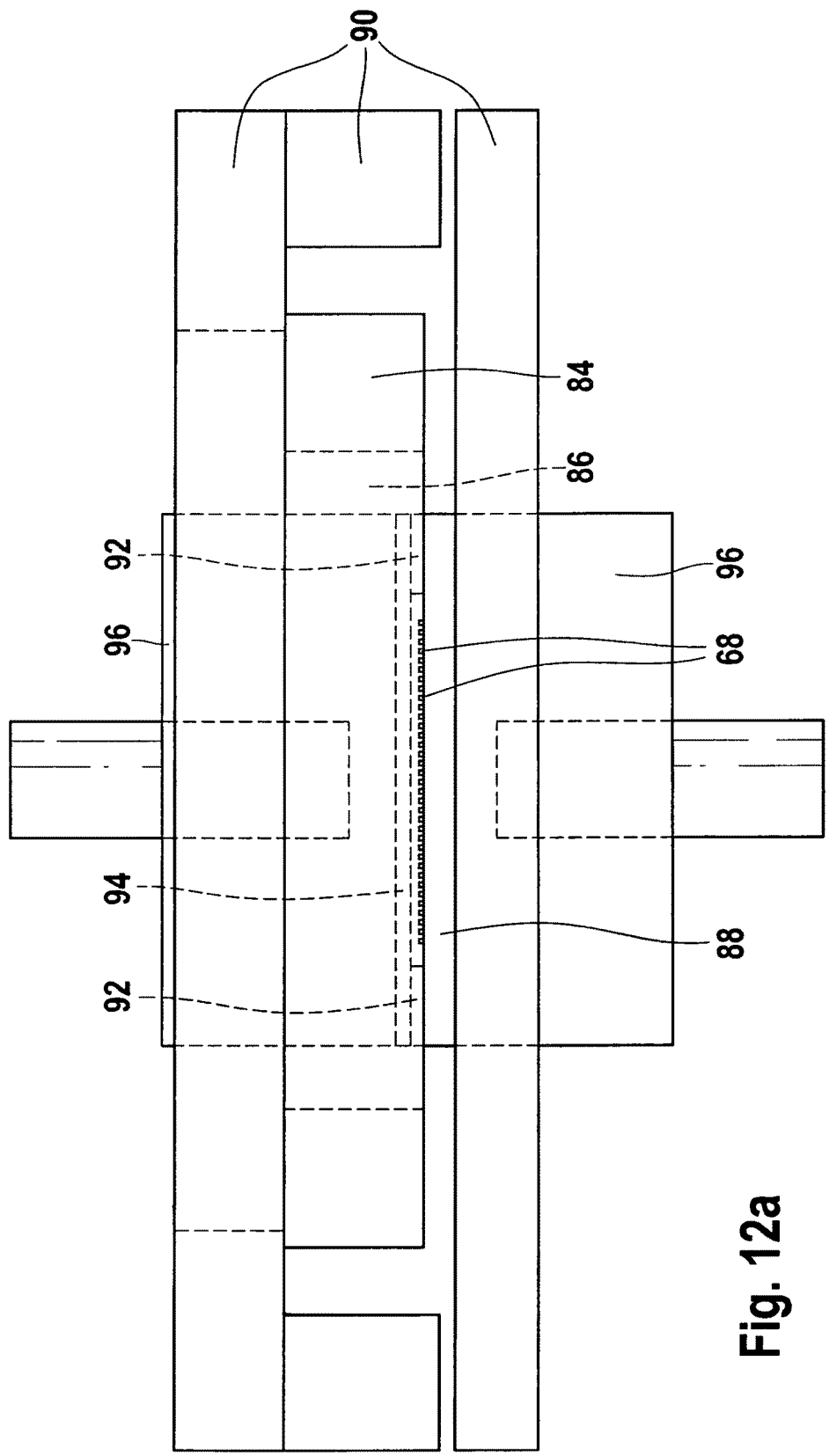
Figure 12B:
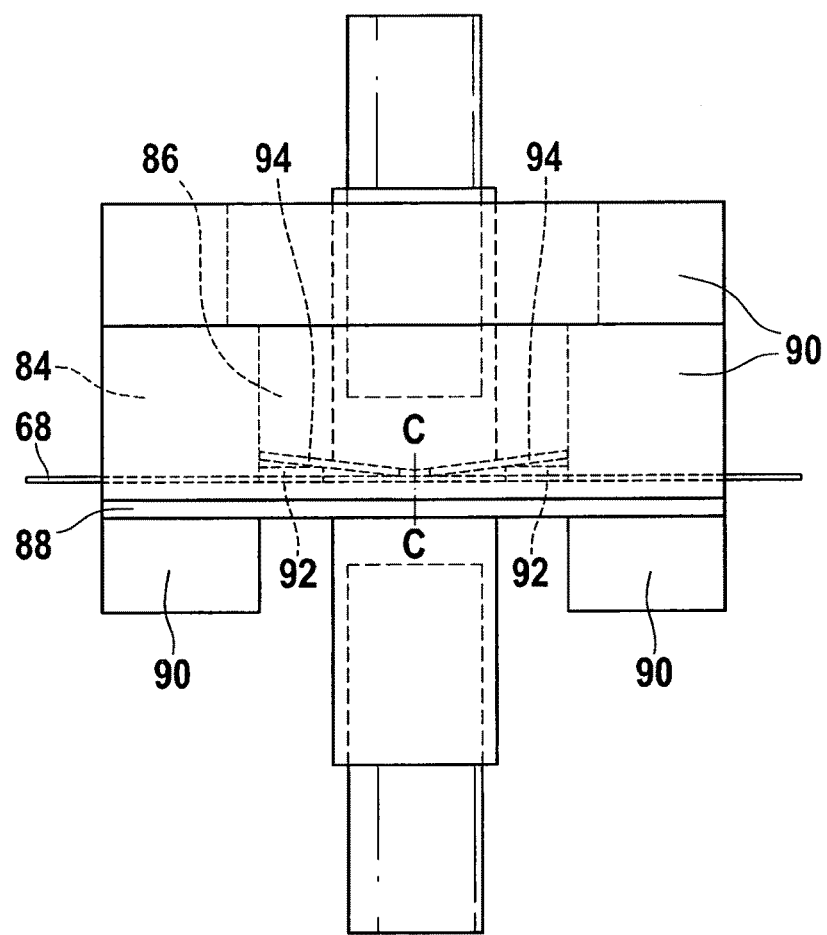
Figure 12C:
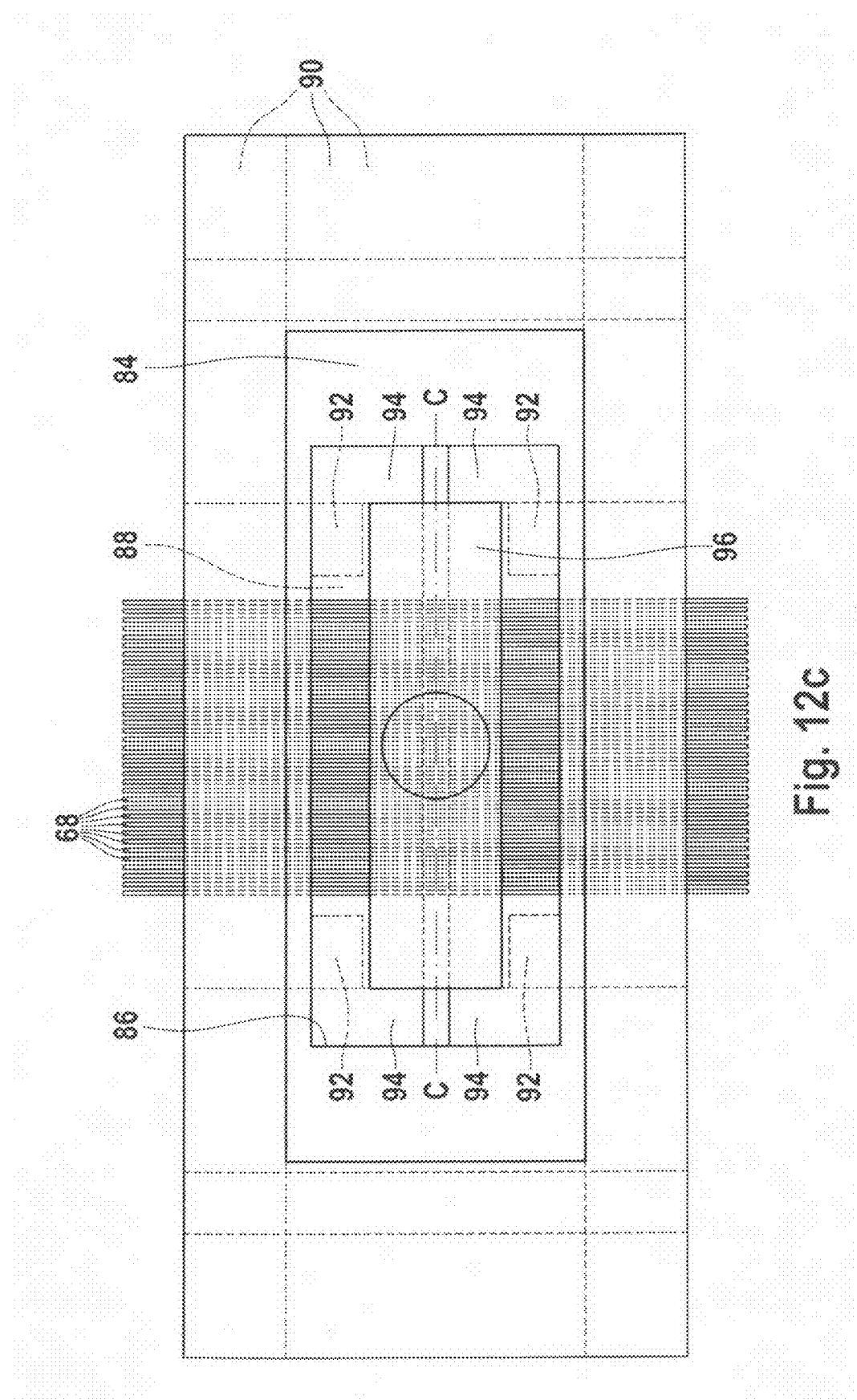

As can be gathered from FIG. 10, a total of four washers 92 are then placed on first glass wafer 88 to the right and left of fibers 68 and at a certain distance relative to separation plane C-C. In the subsequent step, a second glass wafer 94 is then placed on washers 92 and first glass wafer 88, to the left and right of separation plane C-C. This constellation is shown in a side view in FIG. 11 at the bottom left. Washers 92 are used for achieving an inclined position of second glass wafer 94 relative to first glass wafer 88.

First glass wafer 88, fibers 68 and second glass wafer 94 are then compression-molded with the aid of stamps 96 and under the action of heat. In the process, the desired deformation of fibers 68 and the integral connection of first glass wafer 88, fibers 68 and second glass wafer 94 take place, primarily in the region of separation plane C-C. Due to the inclined position of second glass wafer 94, fibers 68 take on a circular cross-section again as the distance to separation plane C-C increases.

Finally, once cooling has occurred, fibers 68 and first glass wafer 88 are separated along separation plane C-C, and the cut surfaces are ground and polished, so that an optical element 80 is produced.

The advantage of the second exemplary embodiment of the method according to the present invention is that the required structured components, which are produced with great precision, are used only as tool and thus may be used multiple times.

Figure 13A:
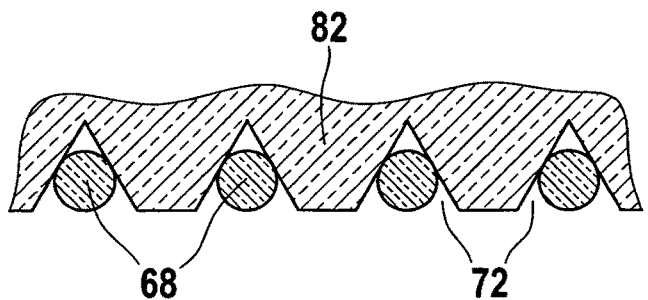
FIG. 13 show various exemplary embodiments of grooves for aligning the fibers.
Figure 13B:
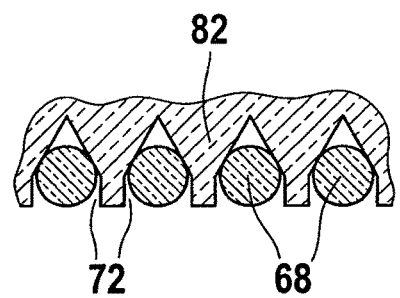
Figure 13C:
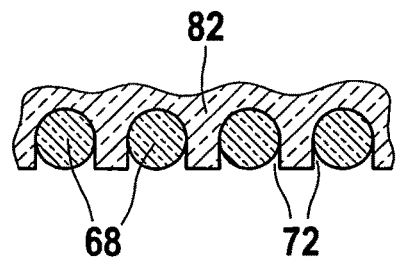

FIG. 13 shows various exemplary embodiments of grooves 72. In FIG. 13*a*, a plurality of V-grooves is illustrated in a sectional view. FIG. 13*b* shows "recessed" V-grooves 72, and in the exemplary embodiment according to FIG. 13*c*, the bottom of grooves 72 has a semicircular design.

What is claimed is:

1. A method for producing a beam-forming device of a diode laser, the method comprising:

aligning fibers in a light-guide device in a center section, so that a plurality of the fibers run in one plane and parallel with respect to each other;

heating the fibers in the center section until they have reached their softening temperature;

pressing the fibers in the center section using one or a plurality of molded parts until their width is greater than their maximum thickness;

cooling the fibers to below their softening temperature following the pressing operation; and separating the fibers in a separation plane, the separation plane lying in the center section and running at a right angle to the longitudinal direction of the fibers in the center section.

2. The method of claim 1, wherein a sheath of the fibers is removed prior to pressing the fibers.

3. The method of claim 1, wherein the fibers are aligned such that their lateral distance corresponds to the distance of the emitters of a diode laser bar in its longitudinal direction, which is its fast-axis.

4. The method of claim 1, wherein the molded parts enter into an integral connection with the fibers during the pressing operation.

5. The method of claim 4, wherein the molded parts form the optical element of the beam-forming device.

6. The method of claim 4, wherein the molded parts are separated in the separation plane.

7. The method of claim 1, wherein the molded parts together with the fibers are separated in the separation plane.

8. The method of claim 1, wherein the lateral distance of the fibers relative to each other is adjusted with the aid of V-grooves in one of the molded parts.

9. The method of claim 1, wherein the lateral distance of the fibers relative to each other is adjusted with the aid of V-grooves in a frame.

\* \* \* \* \*

UNITED STATES PATENT AND TRADEMARK OFFICE
CERTIFICATE OF CORRECTION

PATENT NO. : 8,494,321 B2  Page 1 of 1
APPLICATION NO. : 12/733644
DATED : July 23, 2013
INVENTOR(S) : Herden et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 349 days.

Signed and Sealed this
Eighth Day of September, 2015

Michelle K. Lee
*Director of the United States Patent and Trademark Office*